United States Patent
Kurosu et al.

(10) Patent No.: US 10,262,089 B2
(45) Date of Patent: Apr. 16, 2019

(54) LOGIC SIMULATION METHOD, LOGIC SIMULATION APPARATUS AND COMPUTER-READABLE STORAGE MEDIUM STORING LOGIC SIMULATION PROGRAM

(71) Applicant: Socionext Inc., Yokohama-shi, Kanagawa (JP)

(72) Inventors: Hitoshi Kurosu, Sagamihara (JP); Kenichi Nomura, Akishima (JP)

(73) Assignee: SOCIONEXT INC., Yokohama (JP)

( * ) Notice: Subject to any disclaimer, the term of this patent is extended or adjusted under 35 U.S.C. 154(b) by 367 days.

(21) Appl. No.: 14/989,353

(22) Filed: Jan. 6, 2016

(65) Prior Publication Data

US 2016/0217237 A1    Jul. 28, 2016

(30) Foreign Application Priority Data

Jan. 26, 2015    (JP) .................................. 2015-012306

(51) Int. Cl.
*G06F 17/50*    (2006.01)

(52) U.S. Cl.
CPC ................................ *G06F 17/5031* (2013.01)

(58) Field of Classification Search
CPC ............................................... G06F 17/5031
USPC ....................................................... 703/15
See application file for complete search history.

(56) References Cited

U.S. PATENT DOCUMENTS

| | | | |
|---|---|---|---|
| 2002/0144222 A1 | 10/2002 | Noseyama | |
| 2004/0246032 A1* | 12/2004 | Ogiso | H03B 5/326 327/141 |
| 2008/0180143 A1 | 7/2008 | Shigemori et al. | |
| 2009/0326902 A1 | 12/2009 | Nomura et al. | |

FOREIGN PATENT DOCUMENTS

| | | |
|---|---|---|
| JP | 2000-278118 | 10/2000 |
| JP | 2002-297684 | 10/2002 |
| JP | 2007-49330 | 2/2007 |
| JP | 2007-164363 | 6/2007 |
| WO | WO 2008/117361 A1 | 10/2008 |

OTHER PUBLICATIONS

J-PlatPat Abstract, Japanese Patent Application No. 2000-278118, published Oct. 6, 2000.
J-PlatPat Abstract, Japanese Patent Application No. 2002-297684, published Oct. 11, 2002.
J-PlatPat Abstract, Japanese Patent Application No. 2007-164363, published Jun. 28, 2007.

(Continued)

*Primary Examiner* — Saif A Alhija
(74) *Attorney, Agent, or Firm* — Staas & Halsey LLP

(57) ABSTRACT

A processor detects a phase difference between a feedback clock and a reference clock of a PLL circuit, generates, based on the phase difference, first frequency information indicating a candidate value of a frequency of an output clock being output from the PLL circuit, generates second frequency information by smoothing the first frequency information, and generates the output clock by determining the frequency based on the second frequency information.

12 Claims, 21 Drawing Sheets

(56) References Cited

OTHER PUBLICATIONS

Japanese Office Action dated Nov. 30, 2018 in corresponding Japanese Patent Application No. 2015-012306 with partial English translation (6 pages).
PLL Simulation using Sigma-Delta Modulator for Attaining Arbitrary Frequency Resolution without Spurious by Andy Howard, Agilent Technologies, Apr. 30, 2002 with partial English translation (16 pages).
Japanese Office Action dated Dec. 11, 2018 in corresponding Japanese Patent Application No. 2015-012306 with English machine translation (6 pages).
PLL Simulation using Sigma-Delta Modulator for Attaining Arbitrary Frequency Resolution without Spurious by Andy Howard, Agilent Technologies, Apr. 30, 2002 with partial English translation (14 pages).

* cited by examiner

LOGIC SIMULATION METHOD, LOGIC SIMULATION APPARATUS AND COMPUTER-READABLE STORAGE MEDIUM STORING LOGIC SIMULATION PROGRAM

CROSS-REFERENCE TO RELATED APPLICATION

This application is based upon and claims the benefit of priority of the prior Japanese Patent Application No. 2015-012306, filed on Jan. 26, 2015, the entire contents of which are incorporated herein by reference.

FIELD

The embodiments discussed herein relate to a logic simulation method, a logic simulation apparatus and a computer-readable storage medium storing a logic simulation program.

BACKGROUND

Some types of LSI (Large Scale Integrated circuit) have an analog circuit such as a PLL (Phase Locked Loop) circuit mounted thereon. The PLL circuit, having a function of multiplying the clock frequency or performing skew adjustment of the clock inside the LSI, is applied as a circuit for increasing the speed and scale of the LSI.

Additionally, in recent years, there is proposed, in addition to the PLL circuit which integrally multiplies the frequency, a PLL circuit including a frequency dividing circuit with a variable frequency dividing ratio such as an SSCG (Spread Spectrum Clock Generator), or a Fractional-N PLL having a decimal multiplication function.

When an LSI is designed, a simulation model describing the PLL circuit in terms of functionality using a hardware description language such as Verilog is created, and a logic simulation is performed in order to verify the operation of the PLL circuit.

The simulation model of the PLL circuit which integrally multiplies the frequency includes a phase difference detection unit configured to detect a phase difference between a reference clock and a feedback clock, and a lock detection unit configured to determine, from the phase difference, whether or not the output clock has reached a target frequency. In addition, there are also included a frequency adjustment unit configured to adjust the frequency based on the phase difference, a clock output unit configured to output the clock of the adjusted frequency, and a frequency dividing unit configured to divide the frequency of the output clock and generate a feedback clock.

See, for example, International Publication Pamphlet No. WO 2008/117361.

In a PLL circuit such as an SSCG in which the frequency dividing ratio varies, the frequency dividing ratio is always varying and therefore a phase difference occurs between the reference clock and the feedback clock even when the frequency of the output clock approaches the target frequency. With the logic simulation using the simulation model as described above, the next frequency of the output clock is immediately determined based on the phase difference between the reference clock and the feedback clock. Therefore, a frequency variation which is more rapid than that in the actual PLL circuit is likely to occur, whereby it has been difficult to reproduce the circuit operation with high precision.

SUMMARY

According to an aspect, there is provided a logic simulation method including: detecting, by a processor, a phase difference between a feedback clock and a reference clock of a PLL circuit including a frequency dividing circuit with a variable frequency dividing ratio; generating, by the processor, first frequency information indicating a candidate value of frequency of an output clock being output from the PLL circuit, based on the phase difference; generating, by the processor, second frequency information by smoothing the first frequency information; and generating, by the processor, the output clock by determining the frequency based on the second frequency information.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Several embodiments will be described below with reference to the accompanying drawings.

First Embodiment

Figure 1:
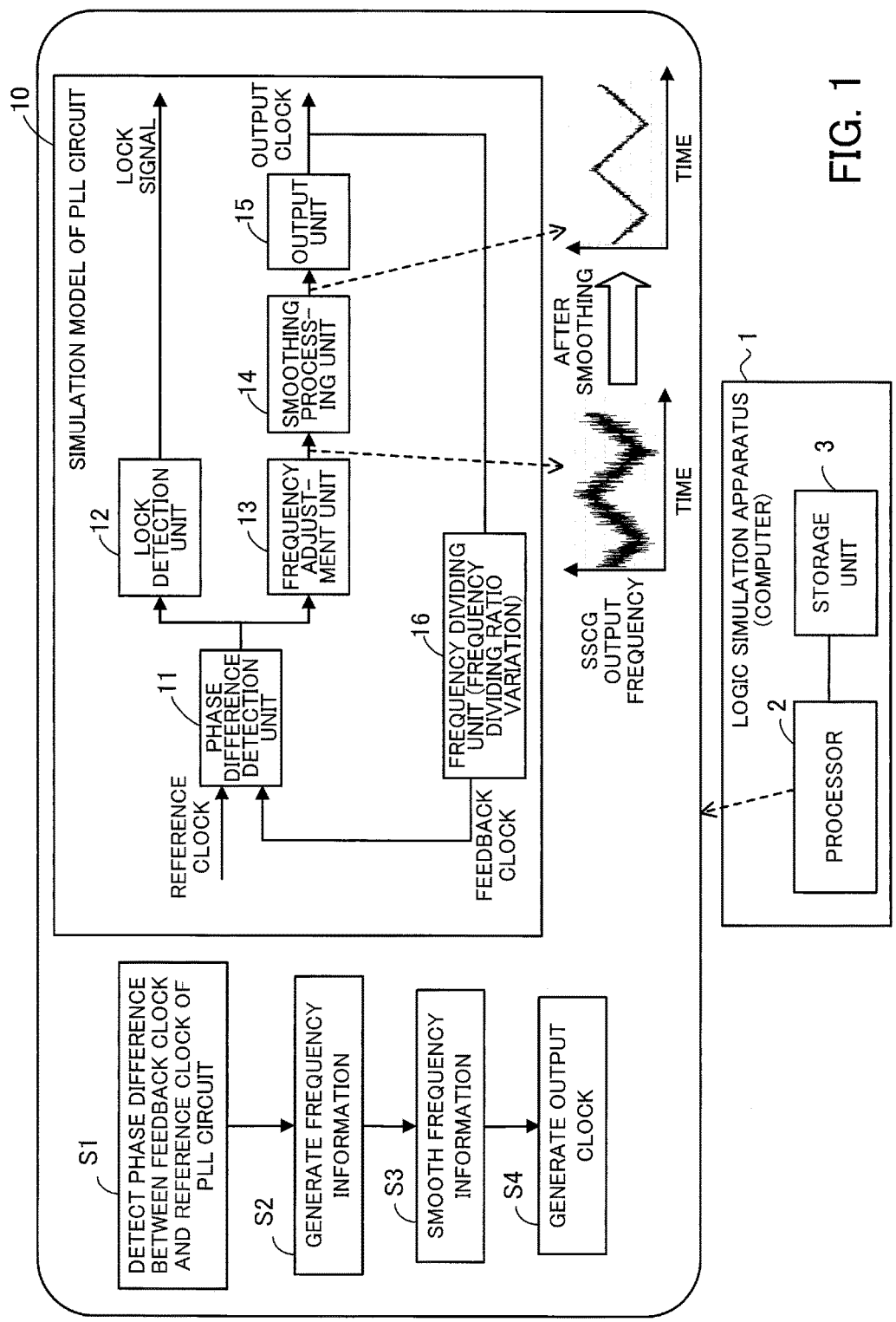
FIG. 1 illustrates an exemplary logic simulation method and logic simulation apparatus of a first embodiment.

FIG. 1 illustrates an exemplary logic simulation method and logic simulation apparatus of a first embodiment.

The logic simulation method and the logic simulation apparatus of the embodiment reproduce the operation of a PLL circuit such as an SSCG or a Fractional-N PLL with a variable frequency dividing ratio.

A logic simulation apparatus 1 is, for example, a computer having a processor 2 and a storage unit 3. The processor 2 realizes respective functions of a simulation model 10 of a PLL circuit including a frequency dividing circuit with a variable frequency dividing ratio, based on data and programs stored in the storage unit 3. The storage unit 3 stores programs to be executed by the processor 2 and various data such as the physical specification of the PLL circuit to be used for logic simulations.

The simulation model 10 of FIG. 1 includes a phase difference detection unit 11, a lock detection unit 12, a frequency adjustment unit 13, a smoothing processing unit 14, an output unit 15, and a frequency dividing unit 16. Each of such functional units is described in a hardware description language such as Verilog, for example.

The phase difference detection unit 11 detects the phase difference between the feedback clock of the PLL circuit and the reference clock having a predetermined frequency.

The lock detection unit 12 determines, based on the detected phase difference, whether or not the frequency of the output clock of the PLL circuit (referred to as an output frequency, in the following) has converged within a predetermined range against a frequency set as a target (referred to as a target frequency, in the following).

The frequency adjustment unit 13 generates frequency information indicating a candidate value of the output frequency, based on the detected phase difference.

The smoothing processing unit 14 smoothes the generated frequency information.

The output unit 15 generates an output clock, based on the smoothed frequency information.

The frequency dividing unit 16 divides the frequency of the generated output clock to generate a feedback clock.

In the logic simulation method using the logic simulation apparatus 1 as described above, the flow of a process when generating output clock will be described in the following, referring to FIG. 1. Respective functions of the simulation model 10 are realized by the processor 2 and therefore description will be given below assuming that each process is performed by the processor 2.

First, the processor 2 detects a phase difference between the feedback clock and the reference clock of the PLL circuit (step S1). Here, the frequency of the reference clock has been preliminarily set to a constant value.

The processor 2 then generates frequency information indicating a candidate value of the output frequency, based on the detected phase difference (step S2).

Subsequently, the processor 2 smoothes the generated frequency information (step S3). FIG. 1 illustrates exemplary frequency information generated by the process at step S2 (output of the frequency adjustment unit 13) and frequency information after smoothing (output of the smoothing processing unit 14). They are examples of the frequency information generated in the simulation model of the SSCG. The vertical axis indicates the output frequency of the SSCG and the horizontal axis indicates the time. Similarly to FIG. 1, although rapid frequency variation is visible before smoothing over time, the rapid frequency variation is suppressed after the smoothing.

The example of the smoothing processing will be described below, in which the processor 2, for example, holds, in the storage unit 3, the frequency information generated based on the detection results of previous phase difference. The processor 2 may then suppress the aforementioned rapid frequency variation by averaging N frequency values (candidate values) representing the frequency information generated based on N (N≥2) successive detection results of the phase difference.

Next, the processor 2 generates an output clock based on the frequency information after smoothing (step S4).

As has been described above, the logic simulation method and the logic simulation apparatus of the embodiment may suppress the rapid frequency variation intrinsic to simulation by smoothing the frequency information based on the phase difference between the feedback clock and the reference clock. Therefore, it is possible to reproduce, with a good precision, the actual operation of the PLL circuit including a frequency dividing circuit with a variable frequency dividing ratio.

In addition, the simulation model 10 as described above does not substantially change the simulation model of the PLL circuit which integrally multiplies the frequency and therefore it is possible to suppress the increase of man-hour taken for logic simulation.

Second Embodiment

In the following, an exemplary logic simulation method and logic simulation apparatus of a second embodiment will be illustrated.

Figure 2:
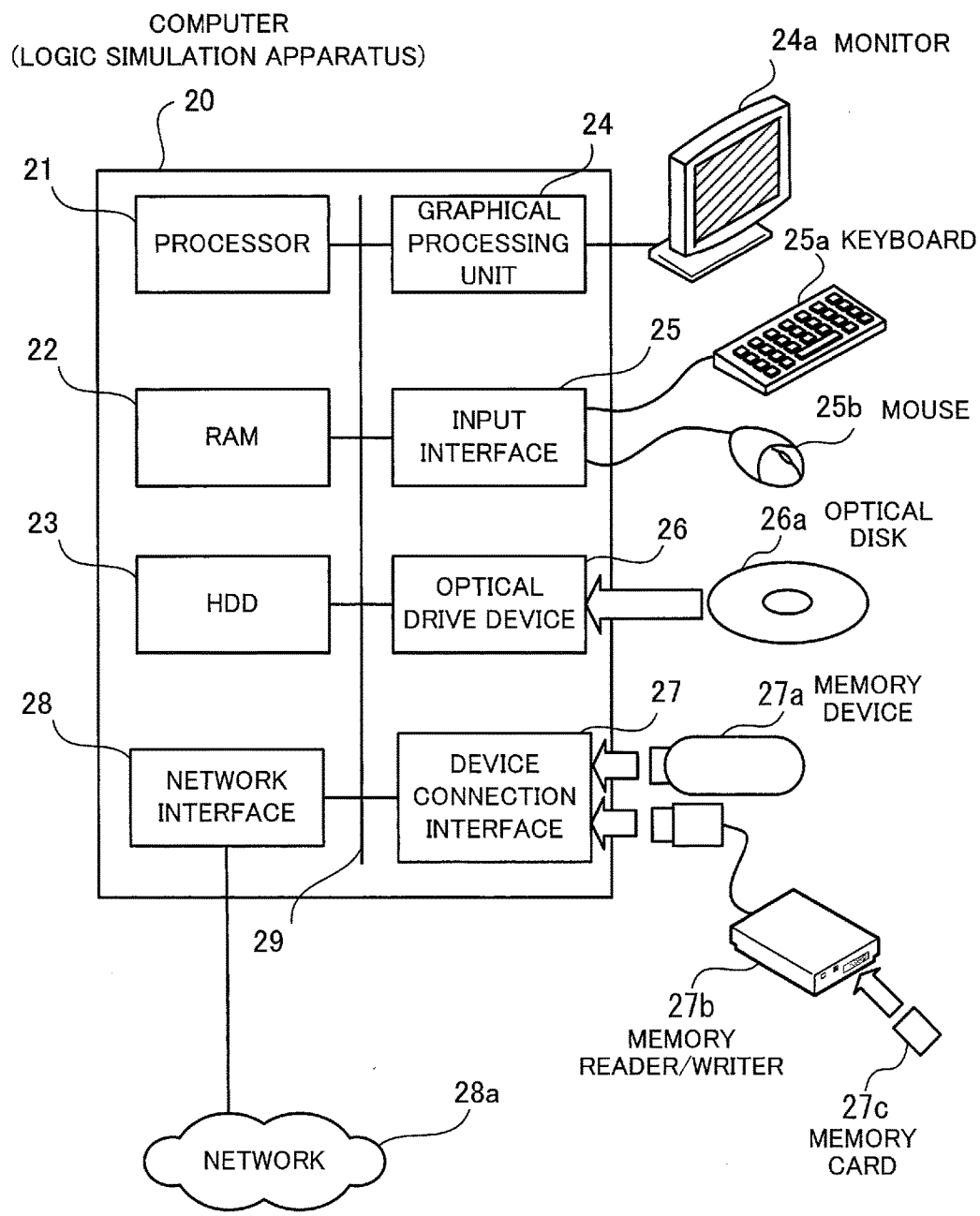
FIG. 2 illustrates an exemplary hardware configuration of a logic simulation apparatus of a second embodiment.

FIG. 2 illustrates an exemplary hardware configuration of a logic simulation apparatus of the second embodiment.

A logic simulation apparatus 20 is a computer, for example, being controlled as a whole by the processor 21. The processor 21 has a RAM (Random Access Memory) 22 and a plurality of peripheral devices connected thereto via a bus 29. The processor 21 may be a multiprocessor. The processor 21 is, for example, a CPU (Central Processing Unit), an MPU (Micro Processing Unit), a DSP (Digital Signal Processor), an ASIC (Application Specific Integrated Circuit), or a PLD (Programmable Logic Device). In addition, the processor 21 may be a combination of two or more elements among the CPU, MPU, DSP, ASIC, and PLD.

The RAM 22 is used as the main storage device of the logic simulation apparatus 20. The RAM 22 temporarily stores at least a part of the OS (Operating System) program or application programs to be executed by the processor 21. In addition, the RAM 22 stores various data needed for process performed by the processor 21.

An HDD (Hard Disk Drive) 23, a graphical processing unit 24, an input interface 25, an optical drive device 26, a device connection interface 27, and a network interface 28, are available as peripheral devices connected to the bus 29.

The HDD 23 magnetically writes and reads out data to and from a built-in disk. The HDD 23 is used as an auxiliary memory of the logic simulation apparatus 20. The HDD 23 stores the OS program, application programs, and various data. A semiconductor memory such as a flash memory may be used as the auxiliary memory.

The graphical processing unit 24 has a monitor 24a connected thereto. The graphical processing unit 24 displays images on the screen of the monitor 24a according to instructions from the processor 21. A display unit using a CRT (Cathode Ray Tube), a liquid crystal display or the like is available as the monitor 24a.

The input interface 25 has a keyboard 25a and a mouse 25b connected thereto. The input interface 25 transmits, to the processor 21, signals sent from the keyboard 25a and the mouse 25b. The mouse 25b is an exemplary pointing device. Another pointing device, such as a touch panel, a tablet, a touchpad, a track ball, or the like, may also be used.

The optical drive device 26 reads data stored in the optical disk 26a using laser beam or the like. The optical disk 26a is a portable storage medium having stored thereon data so as to be readable by reflection of light. A DVD (Digital Versatile Disc), a DVD-RAM, a CD-ROM (Compact Disc Read Only Memory), a CD-R (Recordable)/RW (ReWritable), or the like is available as the optical disk 26a.

The device connection interface 27 is a communication interface for connecting peripheral devices to the logic simulation apparatus 20. For example, the device connection interface 27 may have a memory device 27a or a memory reader/writer 27b connected thereto. The memory device 27a is a storage medium provided with a communication function with the device connection interface 27. The memory reader/writer 27b is a device configured to write data to or read out data from a memory card 27c. The memory card 27c is a card-type storage medium.

The network interface 28 is connected to a network 28a. The network interface 28 transmits and receives data to and from other computers or communication devices via the network 28a.

The processing function of the second embodiment may be realized by the aforementioned hardware configuration. The logic simulation apparatus 1 of the first embodiment illustrated in FIG. 1 may also be realized by a hardware configuration similar to that of the logic simulation apparatus 20 illustrated in FIG. 2.

The logic simulation apparatus 20 realizes the processing function of the second embodiment by executing, for example, a program stored on a computer-readable storage medium. The program having described therein the content of processing to be performed by the logic simulation apparatus 20 may be recorded on various storage media. For example, the program to be executed by the logic simulation apparatus 20 may be stored in the HDD 23. The processor 21 loads, to the RAM 22, at least a part of the program in the HDD 23, and executes the program. In addition, the program to be executed by the logic simulation apparatus 20 may be stored on a portable storage medium such as the optical disk 26a, the memory device 27a, or the memory card 27c. The program stored on the portable storage medium is installed in the HDD 23 via control from the processor 21, for example, and subsequently becomes executable. In addition, the processor 21 may also read out and execute the program directly from the portable storage medium.

Functional Block Diagram of Logic Simulation Apparatus

Figure 3:
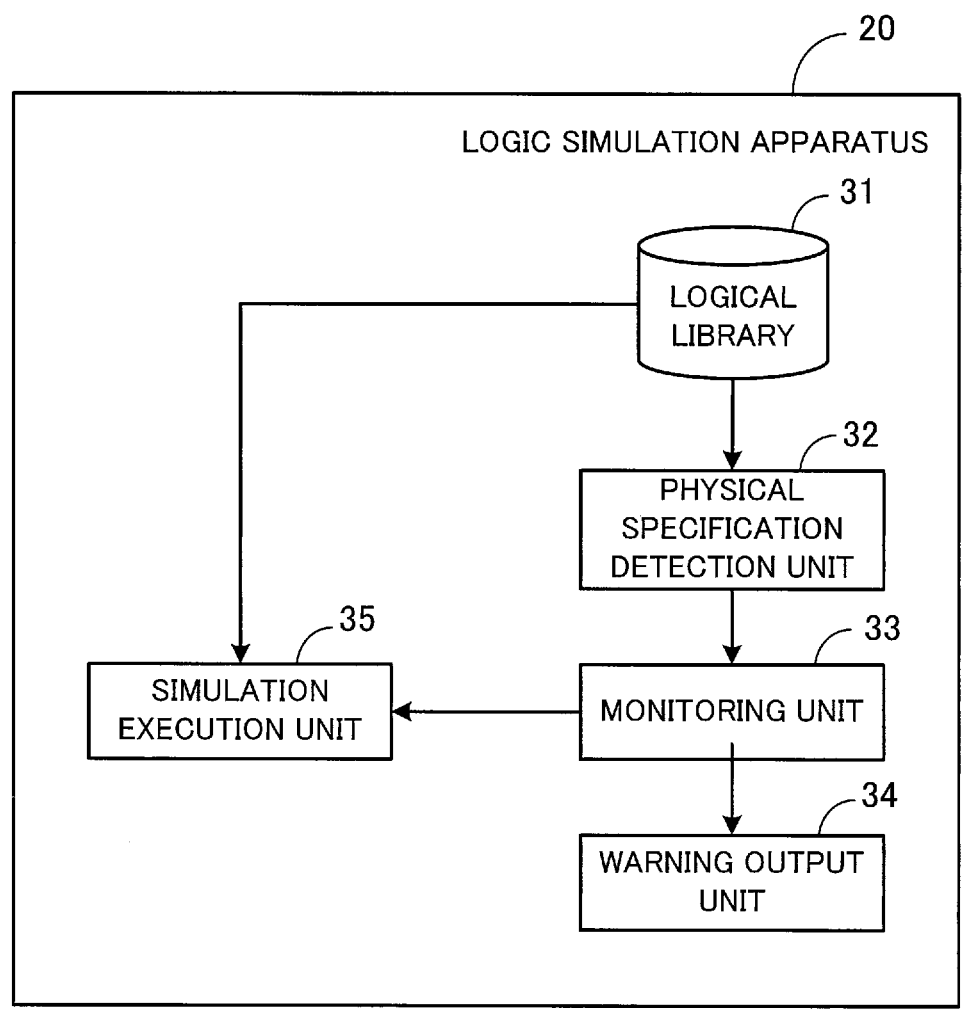
FIG. 3 is a functional block diagram of the exemplary logic simulation apparatus.

FIG. 3 is a functional block diagram of the exemplary logic simulation apparatus.

The logic simulation apparatus 20 has a logical library 31, a physical specification detection unit 32, a monitoring unit 33, a warning output unit 34, and a simulation execution unit 35.

The logical library 31 has described therein, a physical specification of an analog circuit, as well as the logical operation of the analog circuit to be verified. The logical library 31 is stored in the HDD 23 illustrated in FIG. 2, for example.

The physical specification detection unit 32, the monitoring unit 33, the warning output unit 34, and the simulation execution unit 35 are realized by the processor 21 illustrated in FIG. 2 executing a program stored in the HDD 23, for example.

The physical specification detection unit 32 detects the physical specification of the analog circuit to be verified from the logical library 31. The physical specification of the analog circuit to be verified includes the activation sequence indicating the setting of signals to be input when activating the analog circuit such as the PLL circuit, or the frequency tolerance of the output clock and the feedback clock.

The logic simulation apparatus 20 of the embodiment detects the physical specification of a PLL circuit including a frequency dividing circuit with a variable frequency dividing ratio such as an SSCG or a Fractional-N PLL, as well as a PLL circuit including a frequency dividing circuit with an integrally multiplied frequency dividing ratio.

Figure 4:
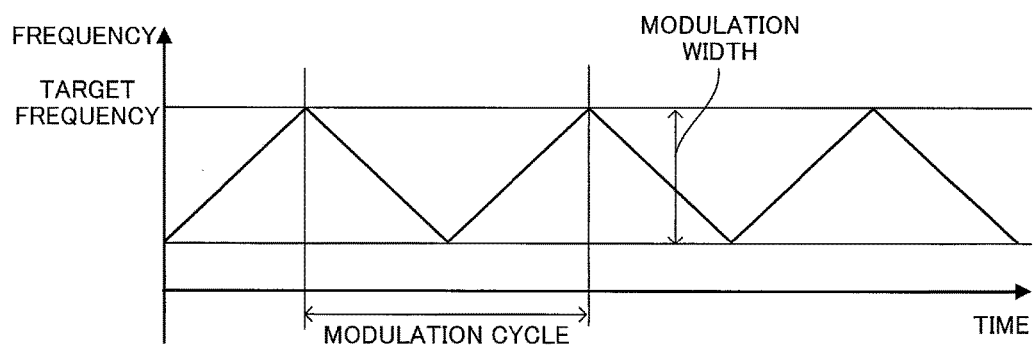
FIG. 4 illustrates an exemplary physical specification of an SSCG (part 1)
Figure 5:
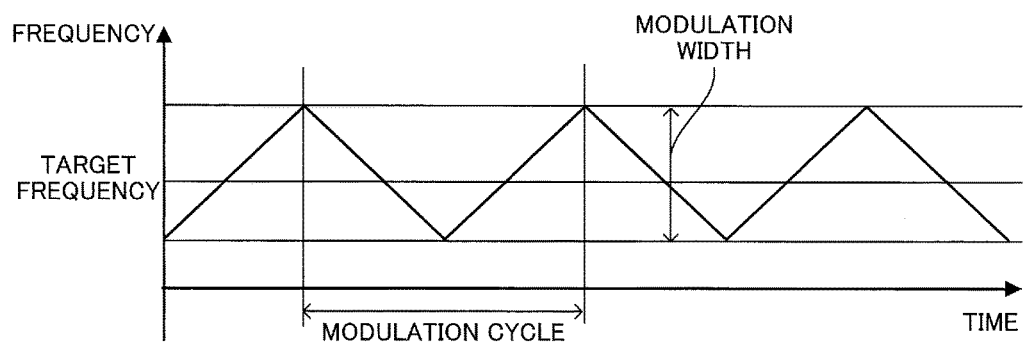
FIG. 5 illustrates an exemplary physical specification of an SSCG (part 2)

FIGS. 4 and 5 illustrate an exemplary physical specification of an SSCG. The vertical axis indicates the frequency and the horizontal axis indicates the time.

The SSCG includes down spread which varies the frequency with the target frequency being the upper limit and center spread which varies the frequency with the target frequency being at the center. FIG. 4 illustrates the variation of the frequency for the case of down spread, and FIG. 5 illustrates the variation of the frequency for the case of center spread.

In the SSCG, the physical specification is a value expected to be satisfied by the modulation cycle or the modulation width illustrated in FIGS. 4 and 5, for example. The modulation cycle is determined by the modulation frequency and the modulation width is determined by the modulation ratio against the target frequency.

Although the variation of the output frequency of the SSCG is expressed as a triangular wave in FIGS. 4 and 5, it may be a sine-wave or the like.

The description returns to FIG. 3.

The monitoring unit 33 monitors whether or not the signal or setting at the time of logic simulation satisfies the aforementioned physical specification. The signal or setting at the time of logic simulation is, for example, the activation sequence or respective clocks described above.

When the signal or setting at the time of logic simulation does not satisfy the physical specification, the warning output unit 34 displays a warning on the monitor 24a illustrated in FIG. 2, for example.

The simulation execution unit 35 performs logic simulation of the analog circuit based on the description of the logical library 31.

In the following, there is illustrated an example of the simulation execution unit 35 when the logic simulation of the PLL circuit including a frequency dividing circuit with a variable frequency dividing ratio is performed.

Functional Block Diagram of Simulation Execution Unit 35

Figure 6:
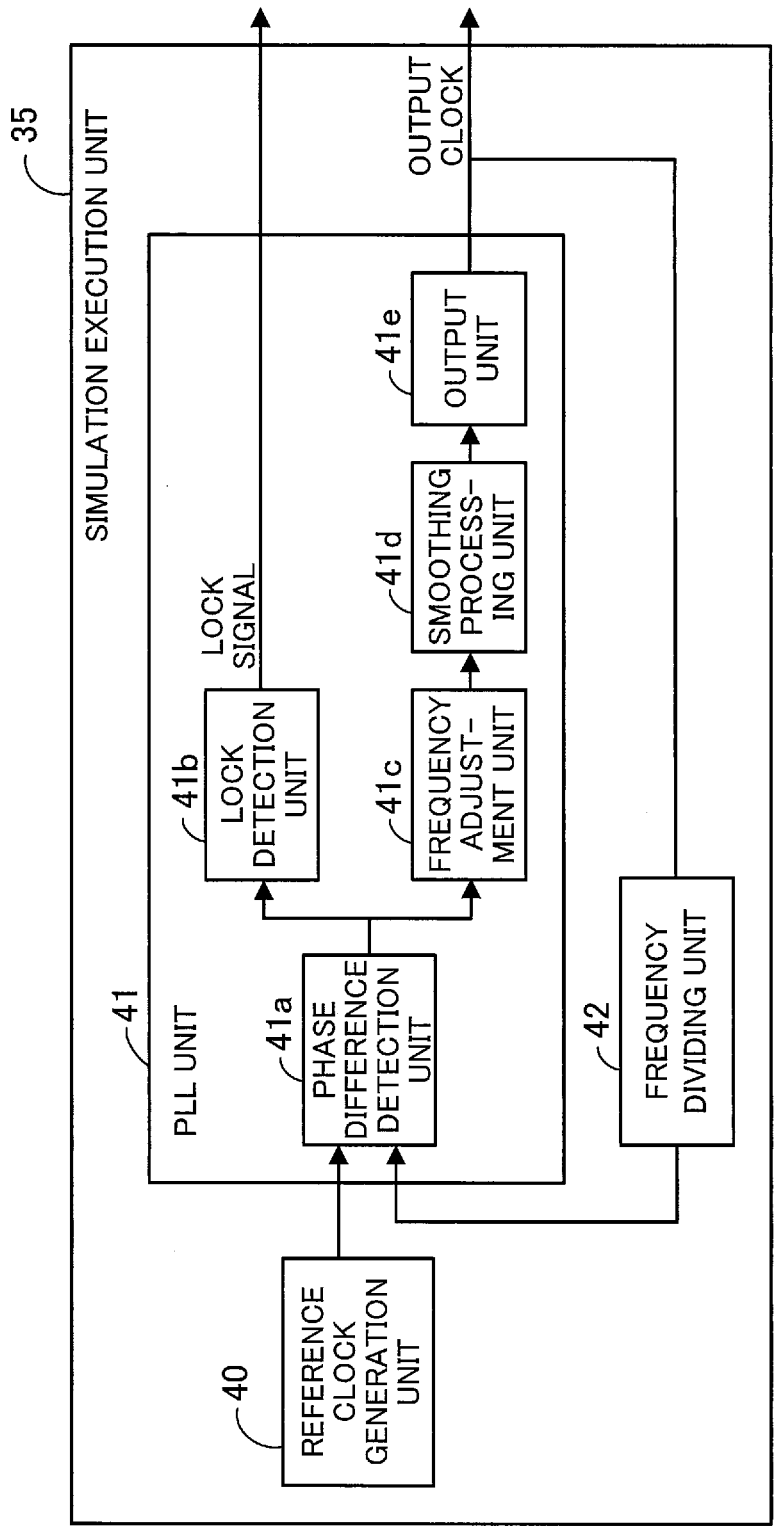
FIG. 6 is a functional block diagram of an exemplary simulation execution unit.

FIG. 6 is a functional block diagram of an exemplary simulation execution unit. Elements of the simulation execution unit 35 include those corresponding to the elements of the simulation model 10 illustrated in FIG. 1.

The simulation execution unit 35 has a reference clock generation unit 40, a PLL unit 41, and a frequency dividing unit 42.

The reference clock generation unit 40 generates a reference clock of a predetermined frequency.

The PLL unit 41 performs the PLL operation based on the reference clock and the feedback clock supplied from the frequency dividing unit 42, and outputs the output clock and a lock signal indicating whether or not the phase difference between the reference clock and the feedback clock is within a predetermined range.

The frequency dividing unit 42 divides the frequency of the output clock to generate the feedback clock. The frequency dividing ratio used by the frequency dividing unit 42 varies. In the case of the SSCG, for example, the frequency dividing unit 42 varies the frequency dividing ratio so as to cause the output frequency to vary as illustrated in FIGS. 4 and 5.

The PLL unit 41 has a phase difference detection unit 41a, a lock detection unit 41b, a frequency adjustment unit 41c, a smoothing processing unit 41d, and an output unit 41e.

The phase difference detection unit 41a detects the phase difference between the feedback clock and the reference clock.

The lock detection unit 41b determines, based on the detected phase difference, whether or not the output frequency has converged within a predetermined range described in the logical library 31 against the target frequency, and generates a lock signal based on the determination result. The lock signal is supplied to the monitoring unit 33.

The frequency adjustment unit 41c generates frequency information indicating a candidate value of the output frequency, based on the detected phase difference.

The smoothing processing unit 41d smoothes the generated frequency information. The smoothing processing unit 41d may be realized by a low-pass filter or the like.

The output unit 41e generates an output clock based on the smoothed frequency information. The output clock is supplied to the monitoring unit 33.

In the following, an example of the smoothing processing unit 41d will be described.

Example of Smoothing Processing Unit 41d

Figure 7:
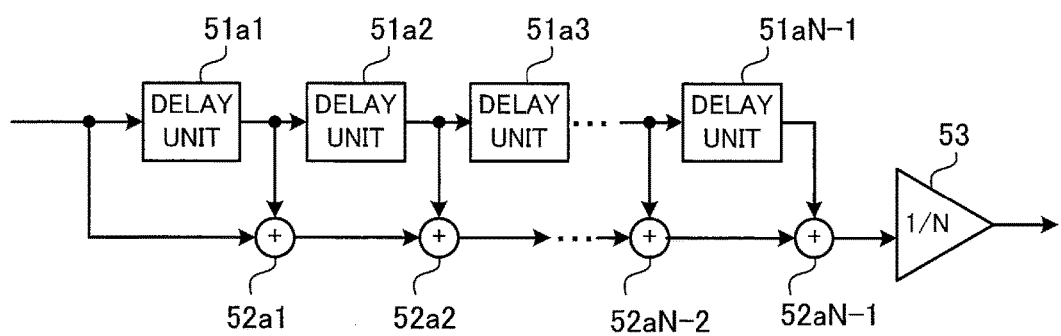
FIG. 7 illustrates an exemplary smoothing processing unit.

FIG. 7 illustrates an exemplary smoothing processing unit.

The smoothing processing unit 41d has N−1 (N≥2) delay units 51a1, 51a2, 51a3, . . . and 51aN−1, N−1 (N≥2) addition units 52a1, 52a2, . . . , 52aN−2 and 52aN−1, and a division unit 53.

The delay units 51a1 to 51aN−1 are connected in series. Each of the delay units 51a1 to 51aN−1 holds a value of frequency to be input as long as the time during which the frequency value (candidate value) is being output from the frequency adjustment unit 41c based on the result of a single phase comparison between the feedback clock and the reference clock, and thereafter outputs the value. Therefore, when a certain frequency value based on the result of phase comparison between the feedback clock and the reference clock is output from the frequency adjustment unit 41c, frequency values based on the previous N−1 results of phase comparison are output from the delay units 51a1 to 51aN−1.

The addition units 52a1 to 52aN−1 are connected in series. The addition unit 52a1 adds the frequency value output from the delay unit 51a1 to the frequency value output from the frequency adjustment unit 41c. Each of the addition units 52a2 to 52aN−1 adds the frequency value output from a corresponding one among the delay units 51a2 to 51aN−1 to the output value of the addition unit of the preceding stage.

The division unit 53 outputs, as the output frequency, a value which is obtained by dividing the output value of the final-stage addition unit 52aN−1 by N.

According to the smoothing processing unit 41d as described above, the average value of the latest frequency value and the previous N−1 frequency values, i.e., N frequency values output from the frequency adjustment unit 41c, turns out to be the latest output frequency.

Figure 8:
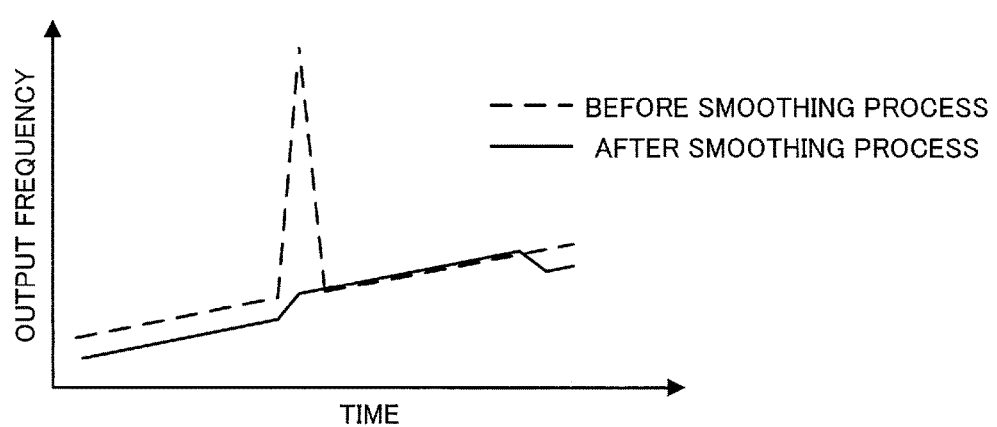
FIG. 8 illustrates an exemplary temporal variation of the output frequency before and after the smoothing process in an SSCG.

FIG. 8 illustrates an exemplary temporal variation of the output frequency before and after the smoothing process in the SSCG. The vertical axis indicates the output frequency and the horizontal axis indicates the time. The dashed line indicates the temporal variation of the frequency before the smoothing process and the solid line indicates the temporal variation of the frequency after the smoothing process.

As illustrated in FIG. 8, the rapid frequency variation occurring during a short cycle before the smoothing process (frequency variation intrinsic to simulation) is smoothed by the smoothing processing unit 41d, and the moderate frequency variation is reflected to the output frequency, accompanying the delay due to the delay units 51a1 to 51aN−1.

Figure 9:
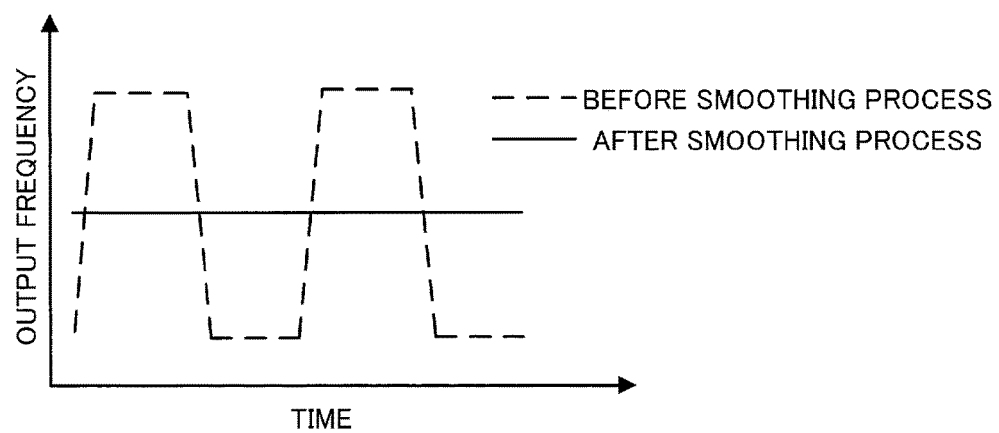
FIG. 9 illustrates exemplary temporal variations of the frequency before and after the smoothing process in a Fractional-N PLL.

FIG. 9 illustrates exemplary temporal variations of the frequency before and after the smoothing process in a Fractional-N PLL. The vertical axis indicates the output frequency and the horizontal axis indicates the time. The dashed line indicates the temporal variation of the frequency before the smoothing process and the solid line indicates the temporal variation of the frequency after the smoothing process.

As illustrated in FIG. 9, the rapid frequency is variation occurring during a short cycle before the smoothing process (frequency variation intrinsic to simulation) is smoothed by the smoothing processing unit 41d, whereby a desired output frequency is obtained.

The simulation model of the PLL circuit such as the simulation execution unit 35 of FIG. 6 is not substantially changed from the simulation model of the PLL circuit which integrally multiplies the frequency (referred to in the following as an integer multiplication PLL circuit). In the following, an exemplary simulation model of the integer multiplication PLL circuit will be described as a comparative example.

Comparative Example

Figure 10:
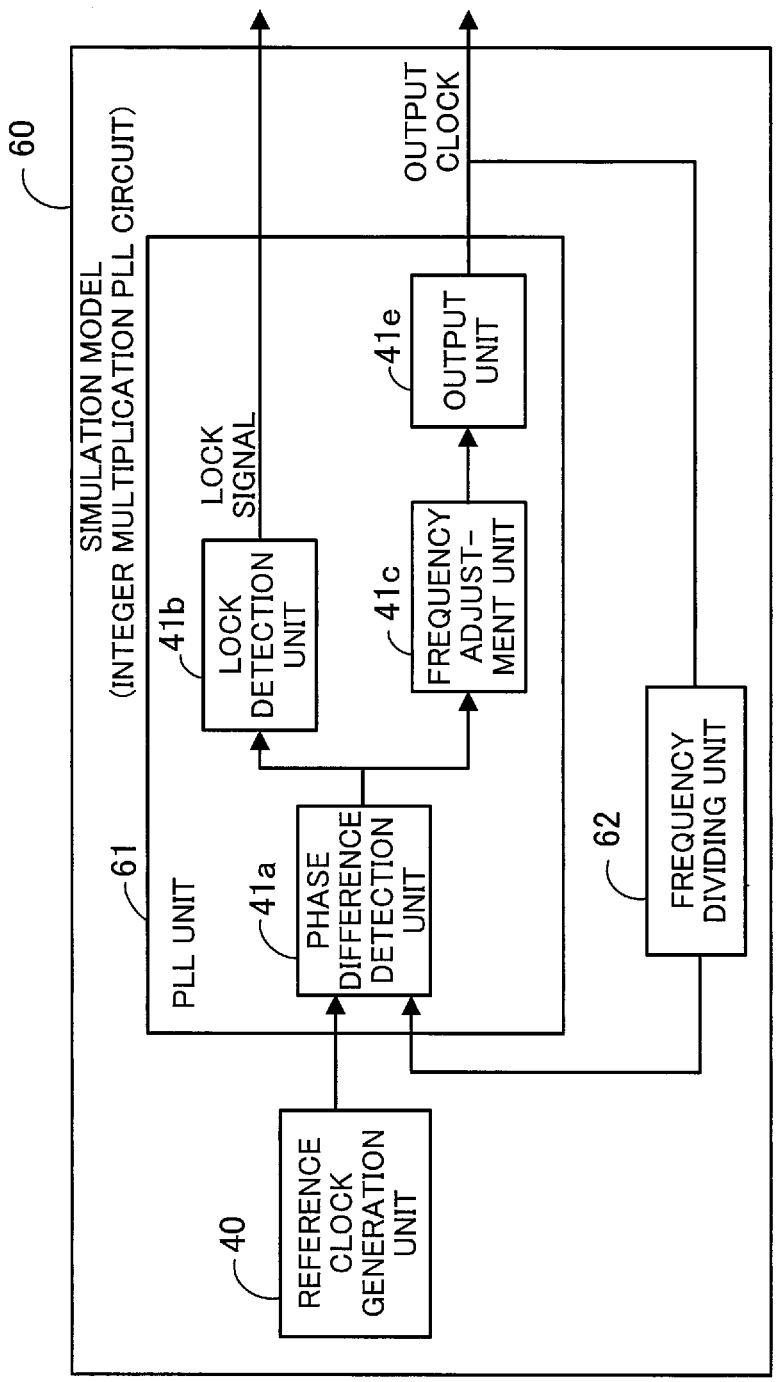
FIG. 10 illustrates an exemplary simulation model of an integer multiplication PLL circuit.

FIG. 10 illustrates an exemplary simulation model of the integer multiplication PLL circuit. Elements which are the same as those illustrated in FIG. 6 are provided with the same symbols.

Unlike the PLL unit 41 illustrated in FIG. 6, a PLL unit 61 in the simulation model 60 of the integer multiplication PLL circuit supplies, directly to the output unit 41e, the frequency information being output from the frequency adjustment unit 41c. In addition, a frequency dividing unit 62 integrally multiplies the frequency of the output clock.

When such a PLL unit 61 of the simulation model is used and the frequency dividing unit 62 is configured to be the frequency dividing unit 42 with a variable frequency dividing ratio illustrated in FIG. 6, an output frequency is given as follows, for example.

Figure 11:
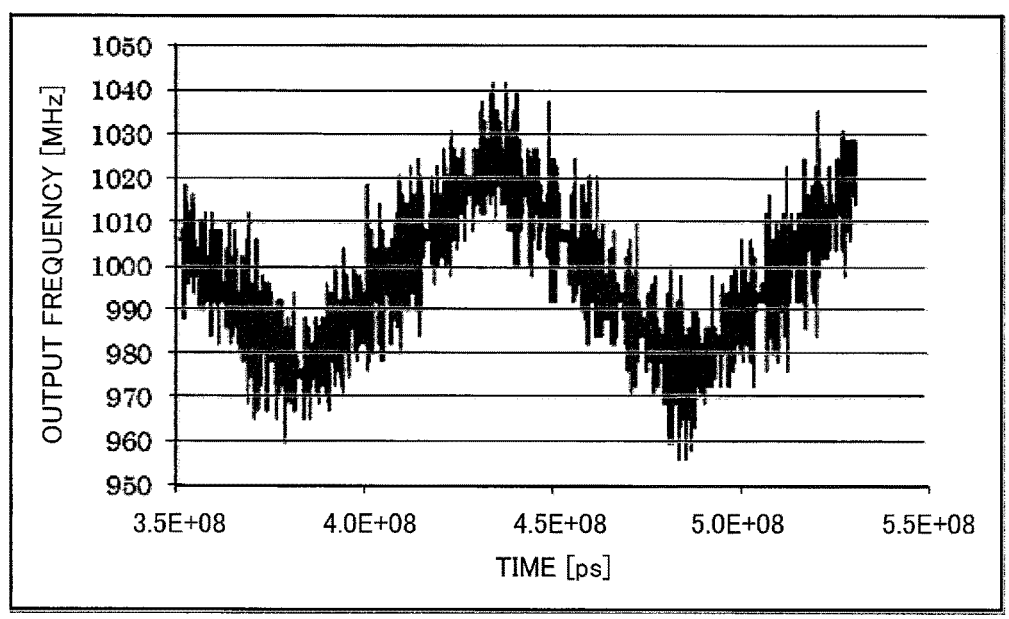
FIG. 11 illustrates an exemplary output frequency of an SSCG for a case using a simulation model without a smoothing processing unit.

FIG. 11 illustrates an exemplary output frequency of the SSCG for a case using a simulation model without the smoothing processing unit.

Figure 12:
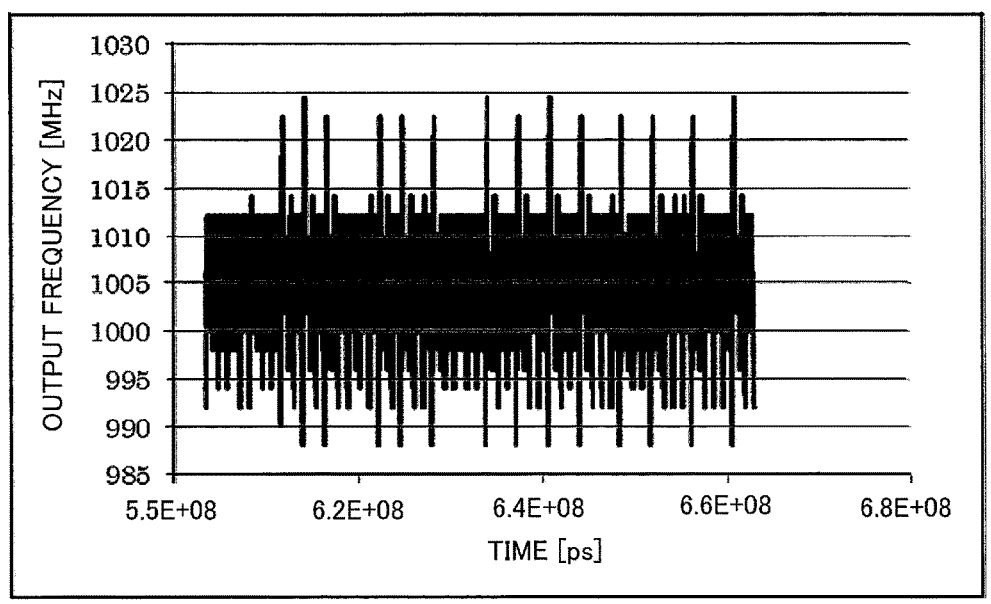
FIG. 12 illustrates an exemplary output frequency of a Fractional-N PLL for a case using the simulation model without a smoothing processing unit.

In addition, FIG. 12 illustrates an exemplary output frequency of the Fractional-N PLL for a case using a simulation model without a smoothing processing unit.

The vertical axis indicates the output frequency (MHz) and the horizontal axis indicates the time (ps).

In the example of FIG. 11, the output frequency varies according to the aforementioned center spread, with the target frequency being 1000 MHz (100-fold multiplication of the frequency of the reference clock). The modulation rate is 5% (±2.5% against target frequency), and the modulation frequency is 9.8 kHz (1/1024th of the frequency of the reference clock).

In addition, FIG. 12 illustrates an example of multiplying the 10-MHz reference clock by 100.5 to obtain an output frequency of 1005 MHz.

In both cases of FIGS. 11 and 12, there are visible a large number of rapid frequency variations (frequency variations intrinsic to simulation) occurring during a short cycle. For instance, in the example of FIG. 12, although the average of all the output frequencies is about 1005 MHz, rapid variations of the output frequency are visible in a range between 1005 MHz −10 MHz and 1005 MHz +20 MHz.

Although it is conceivable to reduce the extent of variation of frequency in a single phase comparison between the reference clock and the feedback clock in order to suppress significant variation of the output frequency, in such a case, the time may increase until locking of the PLL circuit.

In contrast, applying the component illustrated in FIG. 7 as the smoothing processing unit 41d in a simulation model such as the simulation execution unit 35 of FIG. 6 results in an output frequency as follows.

Figure 13:
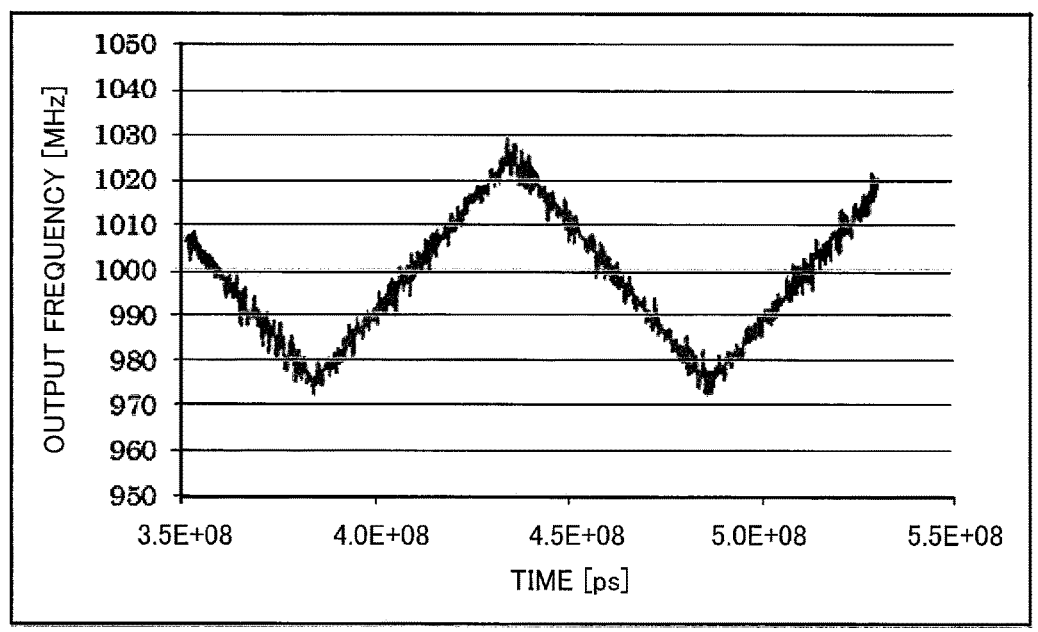
FIG. 13 illustrates an exemplary output frequency of an SSCG for a case using a simulation model with a smoothing processing unit.

FIG. 13 illustrates an exemplary output frequency of the SSCG for a case using a simulation model with the smoothing processing unit.

Figure 14:
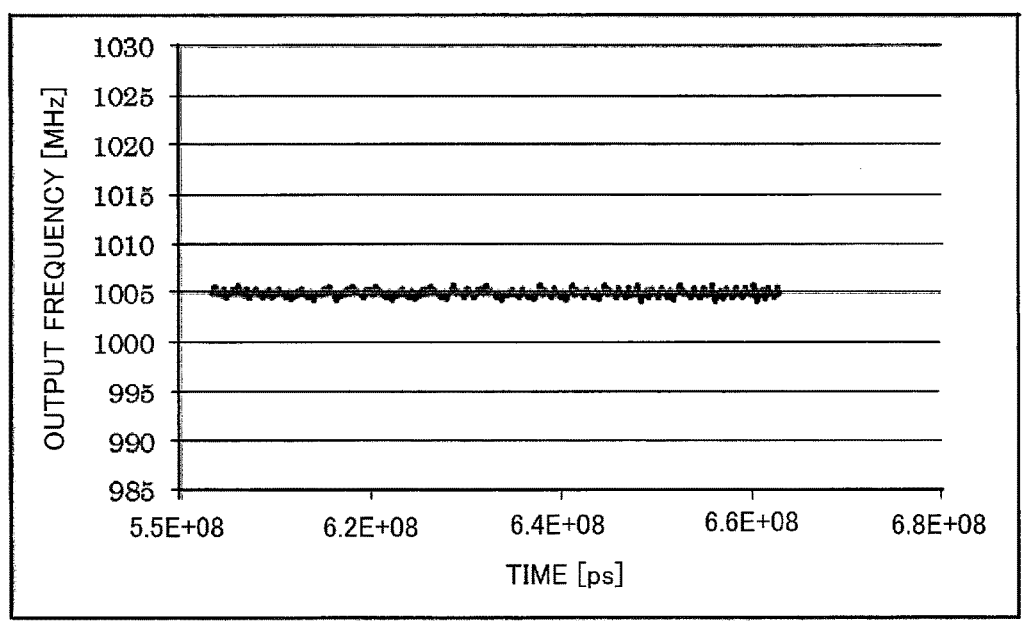
FIG. 14 illustrates an exemplary output frequency of a Fractional-N PLL for a case using a simulation model with a smoothing processing unit.

In addition, FIG. 14 illustrates an exemplary output frequency of the Fractional-N PLL for a case using a simulation model with the smoothing processing unit.

The vertical axis indicates the output frequency (MHz) and the horizontal axis indicates the time (ps).

The input condition is the same as that in the example illustrated in FIGS. 11 and 12 except that the aforementioned N in the smoothing processing unit 41d is set as N=128.

Applying the smoothing processing unit 41d, as illustrated in FIG. 13, suppresses rapid frequency variations occurring during a short cycle to about 1/10 or lower, in comparison with the example of FIG. 11 in which the smoothing process is not performed.

Also with the Fractional-N PLL, rapid frequency variations are suppressed when the smoothing processing unit 41d is applied, in comparison with the example of FIG. 12 in which the smoothing process is not performed. In the example of FIG. 14, the variation of the output frequency falls within a range of 1005 MHz±1 MHz.

In addition, the smoothing process transmits the moderate frequency variation to the output frequency and therefore may also suppress increase of the lock time.

As described above, performing the smoothing process makes it possible to suppress rapid frequency variations during a short cycle intrinsic to simulation, and reproduce, with high precision, the circuit operation of the actual PLL circuit including a frequency dividing circuit with a variable frequency dividing ratio.

When performing logic simulation of the integer multiplication PLL circuit, the simulation execution unit 35 may be the simulation model 60 as illustrated in FIG. 10.

Note that the smoothing processing unit 41d is not limited to the one illustrated in FIG. 7. In the following, another example of the smoothing processing unit 41d will be described.

Another Example of Smoothing Processing Unit

Figure 15:
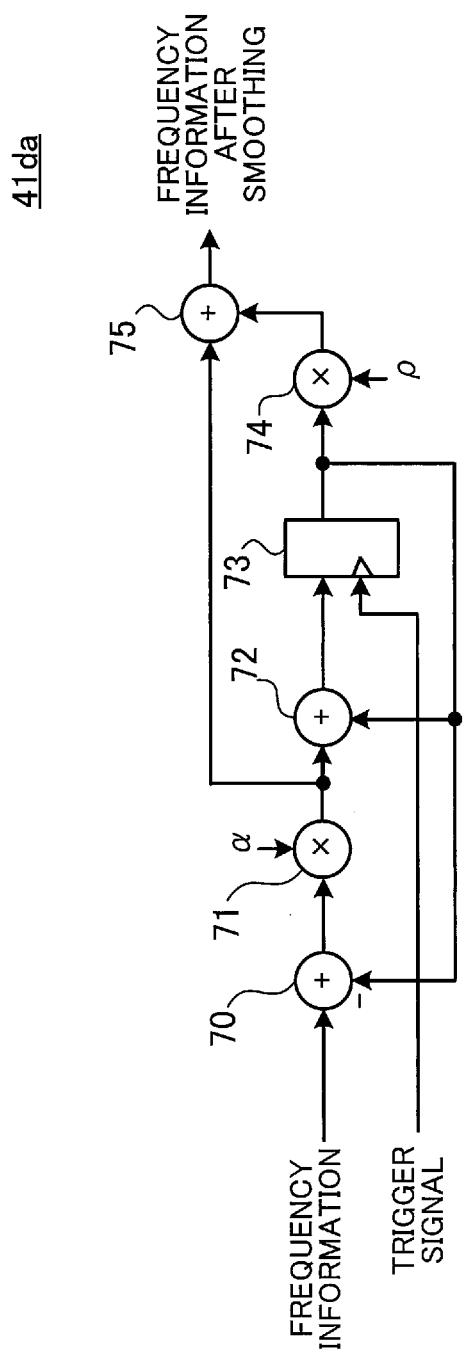
FIG. 15 illustrates another example of the smoothing processing unit.

FIG. 15 illustrates another example of the smoothing processing unit.

A smoothing processing unit 41da has an addition/subtraction unit 70, a multiplication unit 71, an addition unit 72, a register unit 73, a multiplication unit 74, and an addition unit 75.

The addition/subtraction unit 70 subtracts the output value of the register unit 73 from the frequency information (frequency value based on result of phase comparison) being output from the frequency adjustment unit 41c.

The multiplication unit 71 multiplies the output value of the addition/subtraction unit 70 by a coefficient α.

The addition unit 72 adds the output value of the register unit 73 to the output value of the multiplication unit 71.

The register unit 73 obtains the output value of the addition unit 72 at a predetermined cycle according to a trigger signal, for example. The register unit 73 then outputs as much of the obtained output value of the addition unit 72 as the length of the cycle. When the aforementioned cycle according to the trigger signal is prolonged, it may suppress even the moderate frequency variation, and therefore the aforementioned cycle is desired to be shorter than the cycle at which the phase difference detection unit 41a performs phase comparison, or the cycle at which the frequency adjustment unit 41c outputs the frequency information.

The multiplication unit 74 multiplies the output value of the register unit 73 by a coefficient ρ.

The addition unit 75 adds the output values of the multiplication units 71 and 74, and outputs the result as frequency information after smoothing.

The coefficient α is a value smaller than 1, the coefficient ρ is a value of equal to or smaller than one, and thus the relation of the both is α<ρ. The variation width of the output frequency is determined according to the values of the coefficients.

In the smoothing processing unit 41da as described above, the register unit 73 holds, as the initial value, the value of the target frequency, for example. When a certain frequency value is supplied from the frequency adjustment unit 41c to the addition/subtraction unit 70 as the frequency information, the addition/subtraction unit 70 calculates the difference between the frequency value and the frequency value held in the register unit 73 (the initial value being the value of the target frequency). Multiplying the difference by the coefficient α by the multiplication unit 71 reduces the difference. Therefore, the influence of the difference decreases in the frequency value being output from the addition unit 75.

However, the moderate frequency variation is reflected to the output frequency since the frequency value held in the register unit 73 is updated with the suppressed difference.

Therefore, it is possible to reproduce the variation of the output frequency of the SSCG or the Fractional-N PLL.

Figure 16:
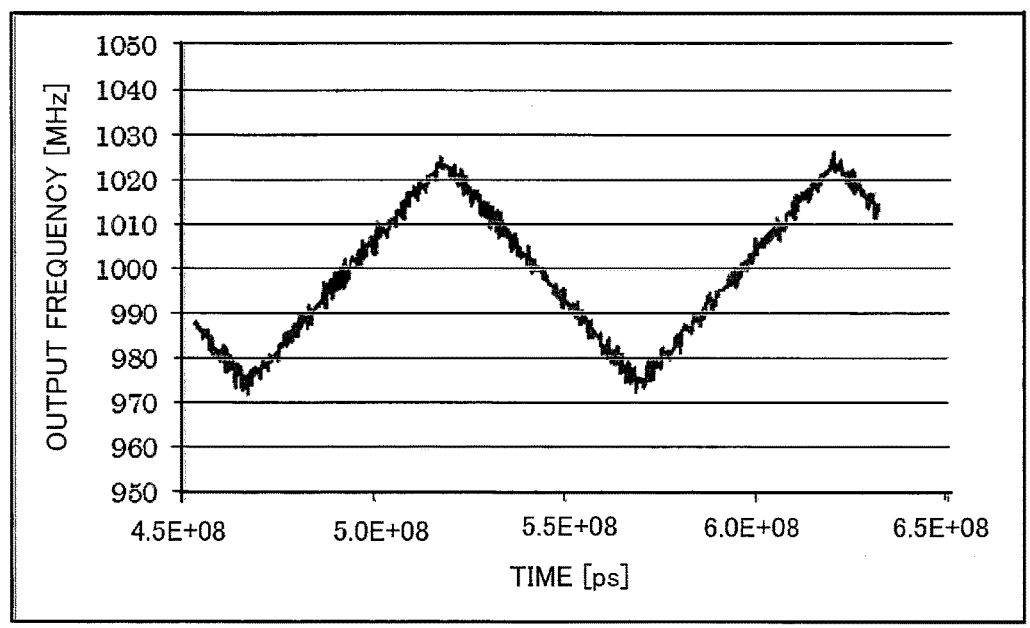
FIG. 16 illustrates an exemplary output frequency of an SSCG for a case using a simulation model with a smoothing processing unit illustrated in FIG. 15.

FIG. 16 illustrates an exemplary output frequency of the SSCG for a case using a simulation model with the smoothing processing unit illustrated in FIG. 15.

Figure 17:
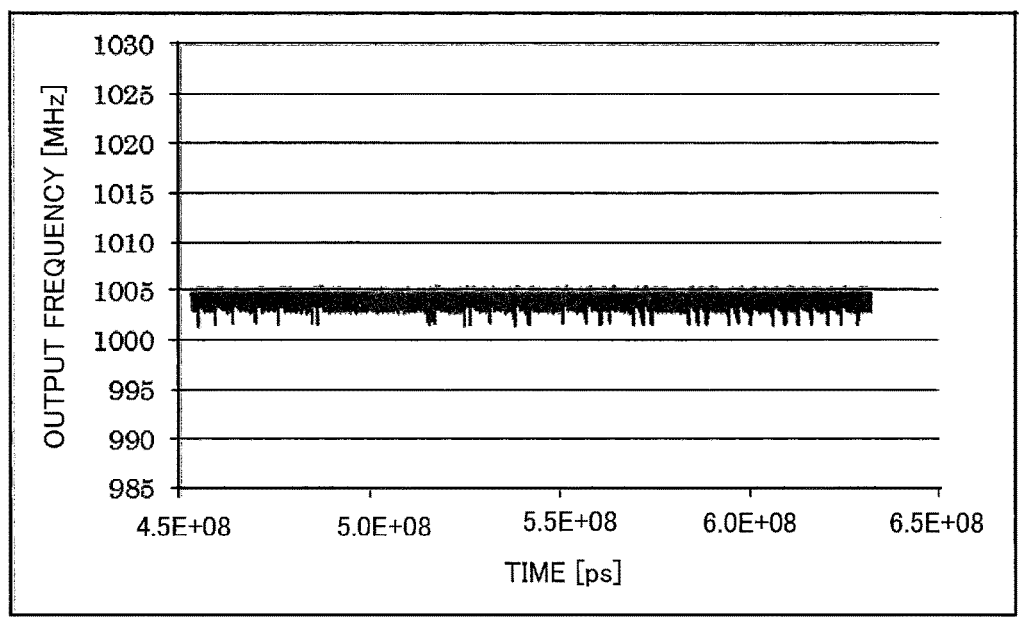
FIG. 17 illustrates an exemplary output frequency of a Fractional-N PLL for a case using a simulation model with a smoothing processing unit illustrated in FIG. 15.

In addition, FIG. 17 illustrates an exemplary output frequency of the Fractional-N PLL for a case using a simulation model with the smoothing processing unit illustrated in FIG. 15.

The vertical axis indicates the output frequency (MHz), and the horizontal axis indicates the time (ps).

Here, the input condition is the same as that in the examples illustrated in FIGS. 11 and 12 except that a and p of the smoothing processing unit 41da of FIG. 15 are set to be 0.001 and 0.999, respectively.

Applying the smoothing processing unit 41da illustrated in FIG. 15 has also suppressed the rapid frequency variations occurring during a short cycle which are visible in FIGS. 11 and 12.

In the following, the flow of an exemplary logic simulation method performed by the logic simulation apparatus 20 illustrated in FIG. 3 and the simulation execution unit 35 as illustrated in FIG. 6 will be described referring to a flowchart. Here, the logic simulation apparatus 20 and the simulation execution unit may be realized by control by the processor 21 illustrated in FIG. 2, and therefore description will be given below assuming that each process is performed by the processor 21.

Flow of Logic Simulation Method

Figure 18:
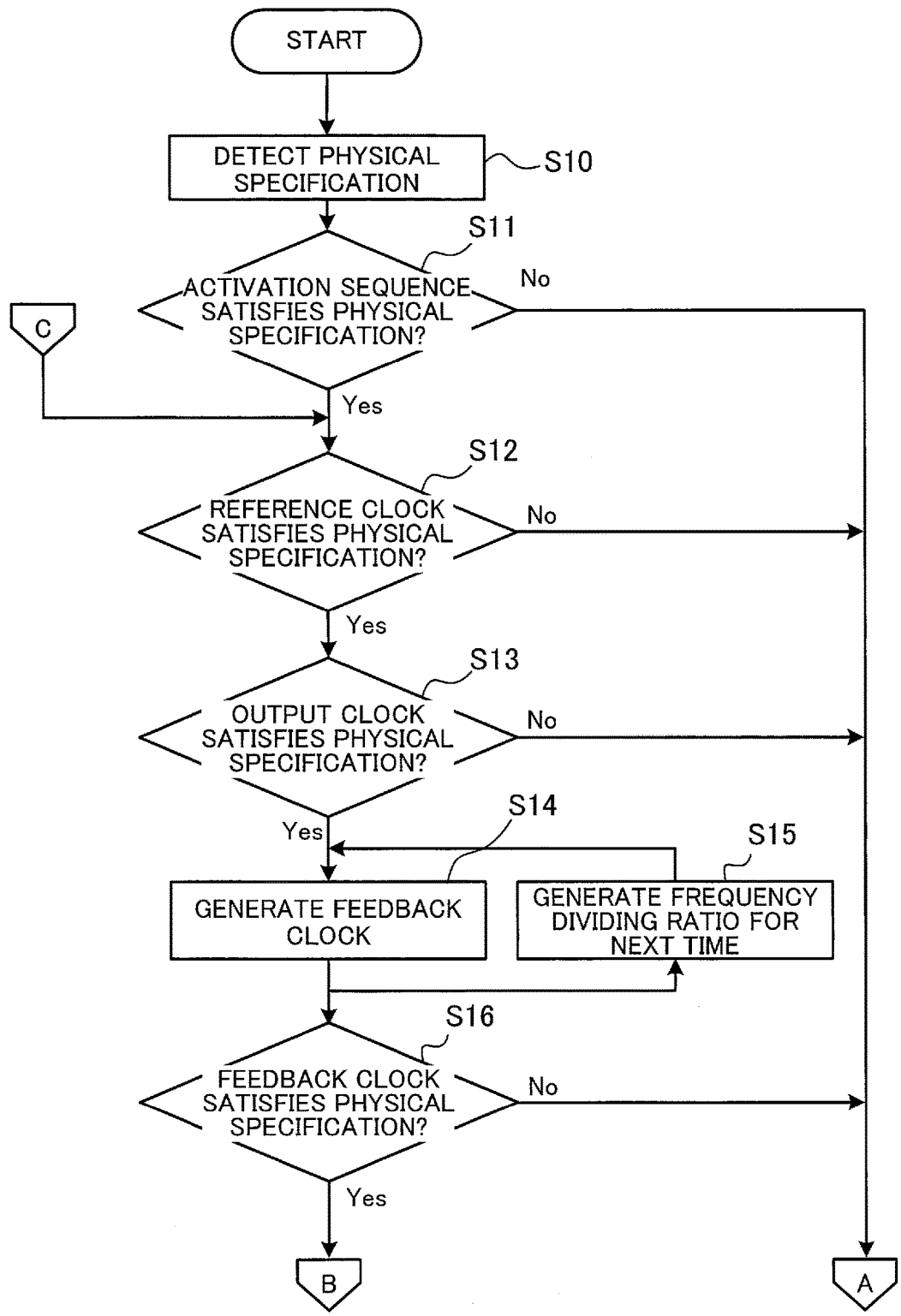
FIG. 18 is a flowchart illustrating a flow of an exemplary logic simulation (part 1)
Figure 19:
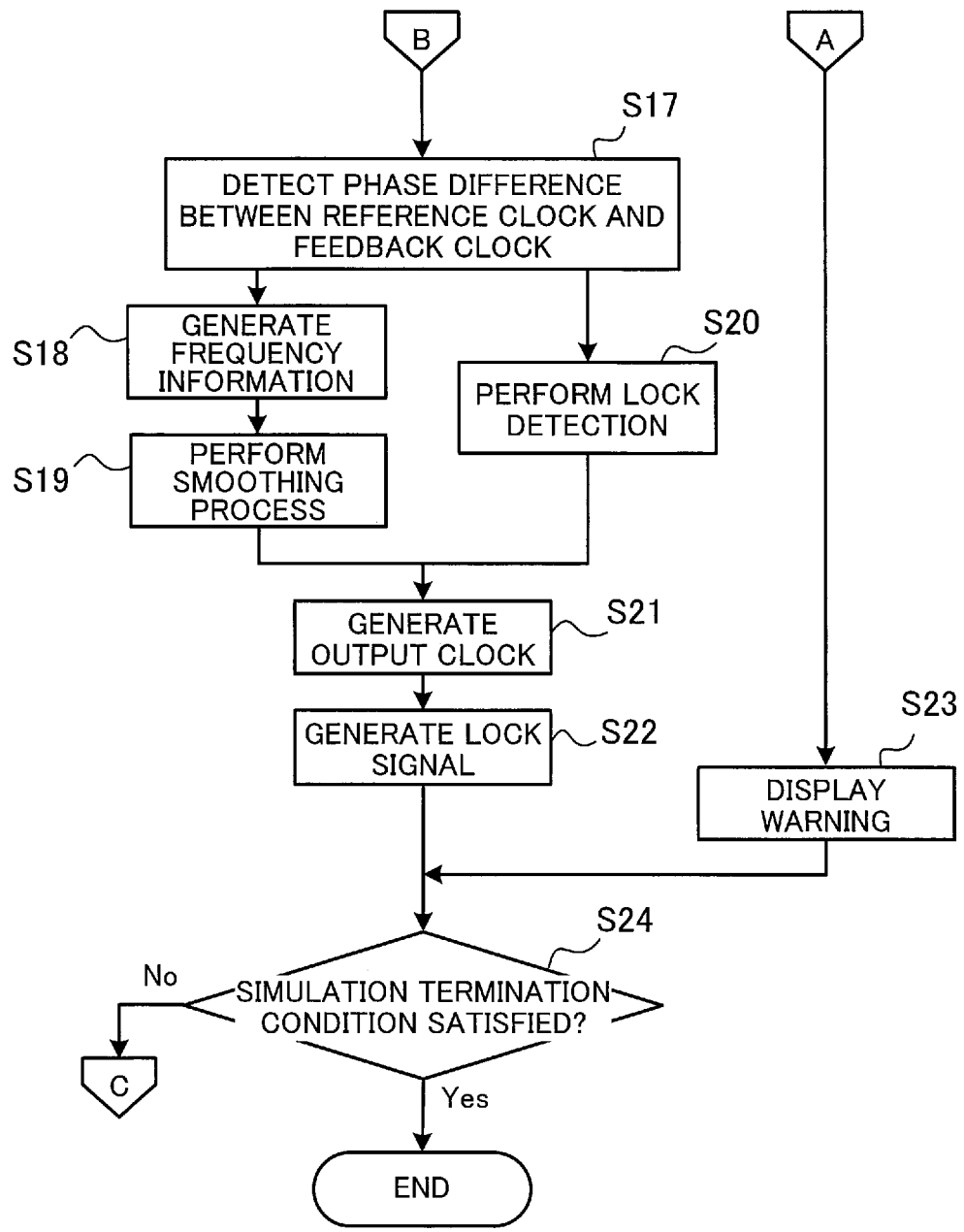
FIG. 19 is a flowchart illustrating a flow of an exemplary logic simulation (part 2)

FIGS. 18 and 19 are flowcharts illustrating the flow of an exemplary logic simulation.

The processor 21 reads out and executes a program for logic simulation from the HDD 23. Accordingly, the logic simulation is started. In the example of FIG. 18, the processor 21 first reads out the logical library 31 stored in the HDD 23, for example, and detects the physical specification of the analog circuit to be verified described in the logical library 31 (step S10).

The processor 21, monitoring for example input/output signals of the analog circuit during the logic simulation of the analog circuit, first determines whether or not the activation sequence when activating the analog circuit satisfies the physical specification (step S11). In a PLL circuit, there may be a case where the sequence of cancellation of reset and setting of the feedback clock, or the order of cancellation of reset of 1/n frequency dividing circuit and cancellation of reset of the PLL block, for example, has been determined by the electro-physical specification. Violation of the order may is result in occurrence of failure at the time of actual physical operation. Therefore, the logical library 31 has described therein an activation sequence preliminarily defined in the physical specification, and the processor 21 determines at the time of logic simulation whether or not the activation sequence set by the user conforms to what has been defined in the physical specification, for example.

Upon determining that the activation sequence does not conform to what has been defined in the physical specification, the processor 21 controls the graphical processing unit 24, for example, to display a warning on the monitor 24a (step S23).

Upon determining that the activation sequence conforms to what has been defined in the physical specification, the processor 21 determines whether or not the reference clock set by the user, for example, satisfies the physical specification (step S12).

In order to realize the performance and function as a PLL circuit, the frequency or the like of the reference clock is limited by the electro-physical specification. Violation of the specification may prevent realization of the phase adjustment function and multiplication function intrinsic to the PLL circuit. The processor 21 therefore, monitors the reference clock to determine whether or not the physical specification is satisfied.

The physical specification of the reference clock for ensuring stable operation of the PLL circuit includes the minimum inputtable frequency, the maximum inputtable frequency, the minimum duty width of H (High) level pulses and L (Low) level pulses, and the like.

Upon determining that the reference clock does not satisfy the physical specification, the processor 21 performs the process of step S23 to display a warning on the monitor 24a.

Upon determining that the reference clock satisfies the physical specification, the processor 21 determines whether or not the output clock of the PLL circuit satisfies the physical specification (step S13).

In order to realize the performance and function as a PLL circuit, the output frequency of the output clock is limited by the electro-physical specification. Violation of the specification may prevent realization of the phase adjustment function and multiplication function intrinsic to the PLL circuit. Therefore, the processor 21 monitors the output clock to determine whether or not the physical specification is satisfied.

The physical specification of the output clock for ensuring stable operation of the PLL circuit includes the minimum outputtable frequency, the maximum outputtable frequency, and the like. When, in addition, the PLL circuit to be verified is an SSCG, the physical specification includes the aforementioned modulation cycle modulation width, and the like.

Upon determining that the output clock does not satisfy the physical specification, the processor 21 performs the process of step S23 to display a warning on the monitor 24a.

Upon determining that the output clock satisfies the physical specification, the processor 21 performs the function of the frequency dividing unit 42 of the simulation execution unit 35 to generate a feedback clock with a predetermined frequency dividing ratio (step S14). When performing logic simulation of the PLL circuit including a frequency dividing circuit with a variable frequency dividing ratio, the processor 21 generates a frequency dividing ratio to be used when generating the feedback clock for the next time (step S15).

Subsequently, the processor 21 determines whether or not the feedback clock satisfies the physical specification (step S16). The physical specification of the feedback clock includes the minimum inputtable frequency, the maximum inputtable frequency, the minimum duty width, acceptable multiplication number setting range (defined by the minimum multiplication number and the maximum multiplication number), and the like.

Upon determining that the feedback clock does not satisfy the physical specification, the processor 21 performs the process of step S23 to display a warning on the monitor 24a.

Upon determining that the feedback clock satisfies the physical specification, the processor 21 performs the function of the phase difference detection unit 41a of the simulation execution unit 35 to detect the phase difference between the reference clock and the feedback clock (step S17). Upon detecting the phase difference, the processor 21 performs the function of the frequency adjustment unit 41c to generate frequency information indicating a candidate value of the output frequency (step S18). The processor 21 then performs the function of the smoothing processing units 41*d* and 41*da* to perform the aforementioned smoothing process on the generated frequency information (step S19).

In addition, upon detecting the phase difference, the processor 21 performs the function of the lock detection unit 41*b* to perform the lock detection process (step S20).

Subsequent to steps S19 and S20, the processor performs the function of the output unit 41*e* to generate an output clock (step S21). In addition, upon detecting a lock in the process at step S20, the processor generates a lock signal indicating that the phase difference has converged within a predetermined range (step S22). Upon detecting no lock in the process at step S20, the processor 21 generates a lock signal indicating absence of lock.

Subsequent to steps S22 and S23, the processor 21 determines whether or not the simulation termination condition is satisfied (step S24). For example, upon generating a lock signal indicating that the phase difference has converged within a predetermined range, or displaying a warning, the processor 21 determines that the simulation termination condition has been satisfied and terminates the logic simulation. When the simulation termination condition has not been satisfied, the process is repeated from step S12.

Here, the smoothing process at step S19 differs depending on either the smoothing processing unit 41*d* illustrated in FIG. 7 is used, or the smoothing processing unit 41*da* illustrated in FIG. 15 is used.

Figure 20:
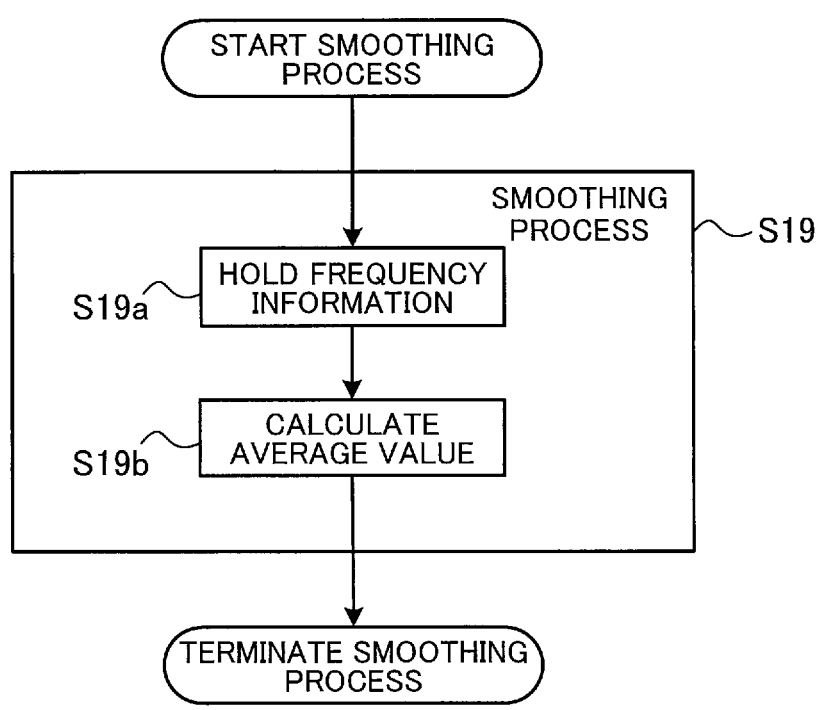
FIG. 20 illustrates a flow of an exemplary smoothing processing for a case using a smoothing processing unit illustrated in FIG. 7.

FIG. 20 illustrates the flow of an exemplary smoothing processing for a case using the smoothing processing unit illustrated in FIG. 7.

In a smoothing process using the smoothing processing unit 41*d*, the processor 21 holds the frequency values generated N-1 times by the function of the frequency adjustment unit 41*c* successively in the RAM 22, for example (step S19*a*). The process corresponds to the process performed by the delay units 51*a*1 to 51*a*N-1 of the smoothing processing unit 41*d* illustrated in FIG. 5.

The processor 21 then calculates the average value of the N frequency values, which are the combination of the newly generated frequency value and the previous N-1 frequency values being held (step S19*b*). The average value turns out to be the latest output frequency. The process corresponds to the process performed by the addition units 52*a*1 to 52*a*N-1 of the smoothing processing unit 41*d*, and the division unit 53.

Figure 21:
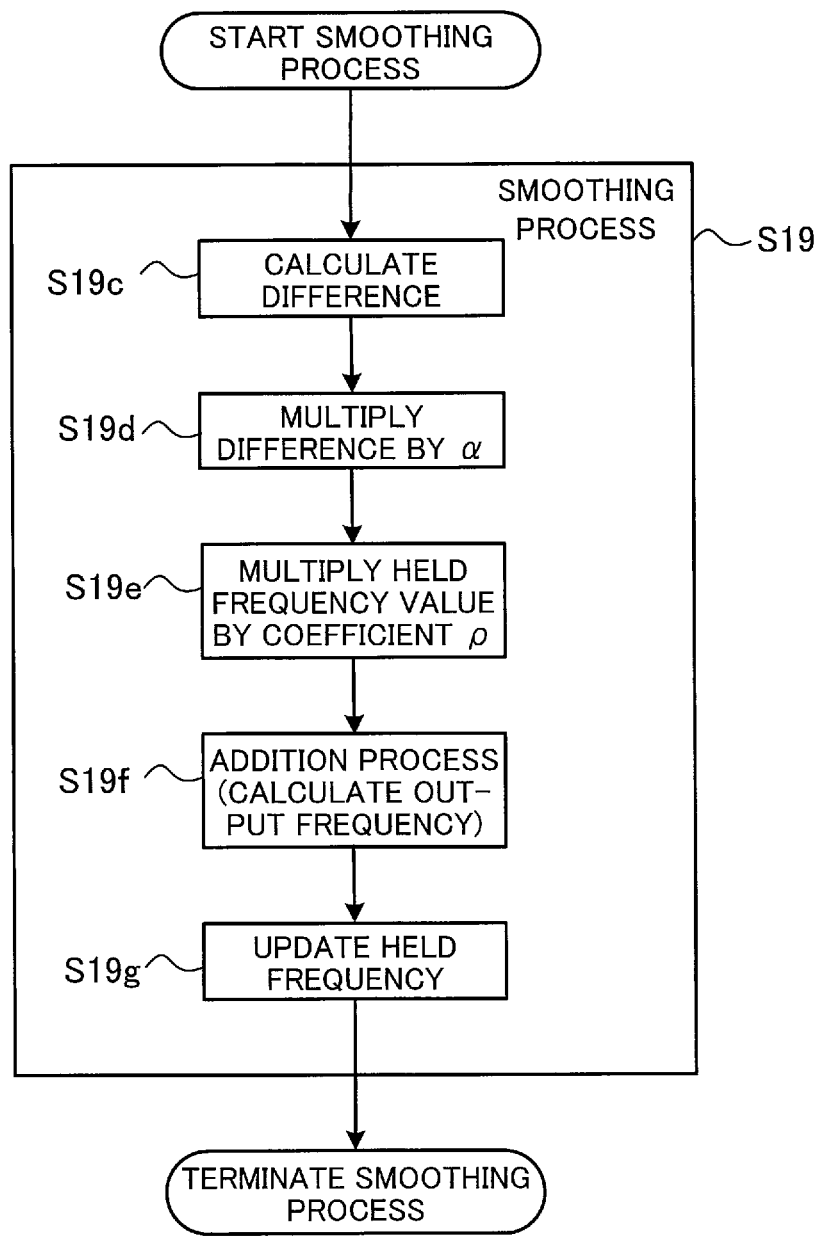
FIG. 21 illustrates a flow of an exemplary smoothing processing for a case using a smoothing processing unit illustrated in FIG. 15.

FIG. 21 illustrates a flow of an exemplary smoothing processing for a case using the smoothing processing unit illustrated in FIG. 15.

In the smoothing process using the smoothing processing unit 41*da*, the processor 21 calculates the difference between the frequency value generated by the function of the frequency adjustment unit 41*c* and the frequency value preliminarily held in the RAM 22, for example (step S19*c*). The process corresponds to the process performed by the addition/subtraction unit 70 of the smoothing processing unit 41*da* illustrated in FIG. 15.

Next, the processor 21 multiplies the calculated difference by the aforementioned coefficient α (step S19*d*). The coefficient α is a value smaller than one and thus the calculated difference turns out to be small. Here, the process corresponds to the process performed by the multiplication unit 71 of the smoothing processing unit 41*da*.

Furthermore, the processor 21 multiplies the held frequency value by the aforementioned coefficient ρ (step S19*e*). The process corresponds to the process performed by the multiplication unit 74 of the smoothing processing unit 41*da*.

Subsequently, the processor 21 adds the values obtained by the processes at steps S19*d* and S19*e*. Accordingly, the output frequency is calculated (step S19*f*). The process corresponds to the process performed by the addition unit 75 of the smoothing processing unit 41*da*.

In addition, the processor 21 updates the held frequency value with a value obtained by adding a held frequency value to the value obtained by the process at step S19*d* (step S19*g*). The process corresponds to the processes of the addition unit 72 of the smoothing processing unit 41*da* and the register unit 73.

Owing to the smoothing process illustrated in FIGS. 20 and 21, rapid frequency variations in the frequency information generated by the function of the frequency adjustment unit 41*c* are suppressed as indicated in FIGS. 13, 14, 16 and 17. In addition, with the moderate frequency variation being reflected to output frequency, it is possible to reproduce, with high precision, the actual operation of the PLL circuit such as the SSCG including a frequency dividing circuit with a variable frequency dividing ratio.

In addition, it is possible to reproduce, with high precision, the operation of the SSCG or the Fractional-N PLL by only adding the smoothing processing units 41*d* and 41*da* to the simulation model of a PLL circuit which integrally multiplies the frequency (referred to in the following as integer multiplication PLL circuit). In other words, a change of the simulation model is small.

The simulation model represented by the simulation execution unit 35 illustrated in FIG. 6 may be used as the simulation model of an integer multiplication PLL circuit. In such a case, it also becomes possible to reproduce, with high precision, the way the output frequency varies following the frequency variation of the reference clock when a reference clock is input so that the frequency varies over time. For example, it becomes possible to reproduce, by logic simulation with high precision, an operation which is close to the physical operation in a configuration in which an SSCG and an integrally multiplying PLL are connected in series so that the output clock of the SSCG turns out to be the reference clock of the integrally multiplying PLL.

Although a point of view of each of the logic simulation method, logic simulation apparatus and program of the present invention has thus been described on the basis of embodiments, they are merely exemplary and not limited to the description provided above.

According to the disclosed logic simulation method, logic simulation apparatus and program, it is possible to reproduce, with high precision, the operation of a PLL circuit including a frequency dividing circuit with a variable frequency dividing ratio.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A method for operating a Phase Locked Loop (PLL) circuit by causing a processor to perform a PLL circuit procedure, the method comprising:

detecting, by a processor, a phase difference between a feedback clock and a reference clock of the PLL circuit including a frequency dividing circuit of which a frequency dividing ratio varies in a continuous manner;

generating, by the processor, first frequency information indicating a first frequency value of an output clock being output from the PLL circuit, based on the phase difference;

generating, by the processor, second frequency information indicating a second frequency value of the output clock by smoothing, based on the first frequency information, the first frequency value generated based on the phase difference currently detected with a plurality of first frequency values of the output clock generated based on a plurality of phase differences between the feedback clock and the reference clock previously detected;

generating, by the processor, the output clock with a frequency corresponding to the second frequency value based on the second frequency information;

determining, by the processor, whether the frequency of the output clock satisfies a physical specification of the PLL circuit which is stored in a storage device; and issuing, by the processor, a warning when the output clock does not satisfy the physical specification; and upon issuing the warning, terminating operations by the processor.

2. The method according to claim 1, wherein the generating second frequency information includes generating the second frequency value representing the second frequency information, by averaging N first frequency values, the N first frequency values representing the first frequency information generated based on N successive detection results of the phase difference, the N being 2 or more.

3. The method according to claim 1, wherein the generating second frequency information includes multiplying a first difference between the first frequency value representing the first frequency information and a third frequency value held in advance by a first coefficient to calculate a second difference which is smaller than the first difference, generating the second frequency value representing the second frequency information by adding, to the second difference, a value obtained by multiplying the third frequency value by a second coefficient which is larger than the first coefficient, and updating the third frequency value with a value obtained by adding the third frequency value to the second difference.

4. The method according to claim 1, wherein the PLL circuit includes a spread spectrum clock generator or is a PLL circuit having a decimal multiplication function.

5. An apparatus comprising a processor configured to perform a Phase Locked Loop (PLL) circuit procedure including:

detecting a phase difference between a feedback clock and a reference clock of a PLL circuit including a frequency dividing circuit of which a frequency dividing ratio varies in a continuous manner;

generating, based on the phase difference, first frequency information indicating a first frequency value of an output clock being output from the PLL circuit;

generating second frequency information indicating a second frequency value of the output clock by smoothing, based on the first frequency information, the first frequency value generated based on the phase difference currently detected with a plurality of first frequency values of the output clock generated based on a plurality of phase differences between the feedback clock and the reference clock previously detected;

generating the output clock with a frequency corresponding to the second frequency value based on the second frequency information;

determining whether the frequency of the output clock satisfies a physical specification of the PLL circuit which is stored in a storage device;

issuing a warning when the output clock does not satisfy the physical specification; and upon issuing the warning, terminating the procedure by the processor.

6. The apparatus according to claim 5, wherein the generating second frequency information includes generating the second frequency value representing the second frequency information, by averaging N first frequency values, the N first frequency values representing the first frequency information generated based on N successive detection results of the phase difference, the N being 2 or more.

7. The apparatus according to claim 5, wherein the generating second frequency information includes multiplying a first difference between the first frequency value representing the first frequency information and a third frequency value held in advance by a first coefficient to calculate a second difference which is smaller than the first difference, generating the second frequency value representing the second frequency information by adding, to the second difference, a value obtained by multiplying the third frequency value by a second coefficient which is larger than the first coefficient, and updating the third frequency value with a value obtained by adding the third frequency value to the second difference.

8. The apparatus according to claim 5, wherein the PLL circuit includes a spread spectrum clock generator or is a PLL circuit having a decimal multiplication function.

9. A non-transitory computer-readable storage medium storing a computer program that causes a computer to perform a Phase Locked Loop (PLL) circuit procedure including:

detecting a phase difference between a feedback clock and a reference clock of a PLL circuit including a frequency dividing circuit of which a frequency dividing ratio varies in a continuous manner;

generating, based on the phase difference, first frequency information indicating a first frequency value of an output clock being output from the PLL circuit;

generating second frequency information indicating a second frequency value of the output clock by smoothing, based on the first frequency information, the first frequency value generated based on the phase difference currently detected with a plurality of first frequency values of the output clock generated based on a plurality of phase differences between the feedback clock and the reference clock previously detected;

generating the output clock with a frequency corresponding to the second frequency value based on the second frequency information;

determining whether the frequency of the output clock satisfies a physical specification of the PLL circuit which is stored in a storage device;

issuing a warning when the output clock does not satisfy the physical specification;

upon issuing the warning, terminating the procedure by the computer.

10. The non-transitory computer-readable storage medium according to claim 9, wherein the generating second frequency information includes generating the second frequency value representing the second frequency information, by averaging N first frequency values, the N first frequency values representing the first frequency information generated based on N successive detection results of the phase difference, the N being 2 or more.

11. The non-transitory computer-readable storage medium according to claim 9, wherein the generating second frequency information includes
- multiplying a first difference between the first frequency value representing the first frequency information and a third frequency value held in advance by a first coefficient to calculate a second difference which is smaller than the first difference,
- generating the second frequency value representing the second frequency information by adding, to the second difference, a value obtained by multiplying the third frequency value by a second coefficient which is larger than the first coefficient, and
- updating the third frequency value with a value obtained by adding the third frequency value to the second difference.

12. The non-transitory computer-readable storage medium according to claim 9, wherein the PLL circuit includes a spread spectrum clock generator or is a PLL circuit having a decimal multiplication function.

* * * * *